United States Patent
Kumar et al.

(10) Patent No.: US 11,055,174 B2
(45) Date of Patent: Jul. 6, 2021

(54) SOFT CHIPKILL RECOVERY FOR BITLINE FAILURES

(71) Applicant: SK hynix Inc., Icheon-si (KR)

(72) Inventors: Naveen Kumar, San Jose, CA (US); Chenrong Xiong, San Jose, CA (US); Aman Bhatia, San Jose, CA (US); Yu Cai, San Jose, CA (US); Fan Zhang, San Jose, CA (US)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/717,857

(22) Filed: Dec. 17, 2019

(65) Prior Publication Data

US 2020/0210286 A1  Jul. 2, 2020

Related U.S. Application Data

(60) Provisional application No. 62/787,158, filed on Dec. 31, 2018.

(51) Int. Cl.
| | |
|---|---|
| *G06F 11/10* | (2006.01) |
| *H03M 13/45* | (2006.01) |
| *H03M 13/11* | (2006.01) |

(52) U.S. Cl.
CPC ..... *G06F 11/1068* (2013.01); *H03M 13/1102* (2013.01); *H03M 13/45* (2013.01)

(58) Field of Classification Search
CPC .................................................. G06F 11/1068
See application file for complete search history.

(56) References Cited

U.S. PATENT DOCUMENTS

| | | | |
|---|---|---|---|
| 6,202,106 B1* | 3/2001 | Baxter ...................... | G06F 3/14 710/22 |
| 10,048,741 B1* | 8/2018 | Shahneous Bari ..... | G06F 3/061 |
| 10,643,675 B2* | 5/2020 | Heo .......................... | G06F 1/26 |
| 10,733,077 B2* | 8/2020 | Menon .................. | G06F 11/302 |
| 2009/0049365 A1 | 2/2009 | Kim et al. | |
| 2009/0052541 A1* | 2/2009 | Kang ................ | H03M 13/6356 375/240.24 |
| 2015/0149855 A1 | 5/2015 | Alhussien et al. | |
| 2018/0167088 A1* | 6/2018 | Vakilinia ........... | H03M 13/2945 |
| 2019/0253907 A1* | 8/2019 | Yao ........................ | H04W 16/02 |

* cited by examiner

*Primary Examiner* — Fritz Alphonse
(74) *Attorney, Agent, or Firm* — Perkins Coie LLP

(57) ABSTRACT

Disclosed are devices, systems and methods for improving performance of a block of a memory device. In an example, performance is improved by implementing soft chipkill recovery to mitigate bitline failures in data storage devices. An exemplary method includes encoding each horizontal row of cells of a plurality of memory cells of a memory block to generate each of a plurality of codewords, and generating a plurality of parity symbols, each of the plurality of parity symbols based on diagonally positioned symbols spanning the plurality of codewords.

20 Claims, 11 Drawing Sheets

SOFT CHIPKILL RECOVERY FOR BITLINE FAILURES

CROSS-REFERENCE TO RELATED APPLICATION

This patent document claims priority to and benefits of U.S. Provisional Patent Application No. 62/787,158 entitled "SOFT CHIPKILL RECOVERY FOR BITLINE FAILURES" and filed on Dec. 31, 2018. The entire content of the before-mentioned patent application is incorporated by reference as part of the disclosure of this patent document.

TECHNICAL FIELD

This patent document generally relates to non-volatile memory devices, and more specifically, to error correction in non-volatile memory devices.

BACKGROUND

Data integrity is important for data storage devices and data transmission. The use of strong error-correction codes (ECCs) is recommended for various types of data storage devices including NAND flash memory devices and dual in-line memory modules (DIMMs). Chipkill is a form of advanced error checking and correcting (ECC) computer memory technology that protects computer memory systems from any single memory chip failure as well as multi-bit errors from any portion of a single memory chip. Improving chipkill operations improves data integrity for both data storage and data transmission.

SUMMARY

Embodiments of the disclosed technology relate to methods, devices and systems that improve performance of a block of a memory device. In an example, performance is improved by implementing soft chipkill recovery to mitigate bitline failures in data storage devices. The methods and devices described in the present document advantageously, among other features and benefits, improve memory errors.

In an example aspect, a method for improving performance of a memory device includes receiving N codewords of a memory block including Nb codewords, wherein N and Nb are positive integers, Nb is greater than two, Nb is less than N, each codeword corresponding to a memory wordline and each of the Nb codewords comprising an error indication, decoding the N codewords, identifying a first set of codewords that decoded incorrectly and a second set of codewords that decoded correctly, obtaining channel information for the first set of codewords that decoded incorrectly, the channel information being associated with a parity check portion of each of the first set of codewords, generating, based on the channel information and decoding results for the second set of codewords that decoded correctly, soft information corresponding to the Nb codewords, the soft information for at least one symbol of the Nb codewords comprising a symbol decision and a probability associated with the symbol decision, identifying, based on the soft information, a candidate bitline that is likely to have experienced a bitline failure, updating the soft information corresponding to the candidate bitline, and performing a decoding operation on the Nb codewords.

In another example aspect, a method for improving performance of a memory device includes encoding each horizontal row of cells of a plurality of memory cells of a memory block to generate each of a plurality of codewords, and generating a plurality of parity symbols, each of the plurality of parity symbols based on diagonally positioned symbols spanning the plurality of codewords.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Chipkill operations may be performed using a variety of error checking and correcting (ECC) implementation. In an example, chipkill operations can be implemented by scattering the bits of a Hamming code ECC word across multiple memory chips, such that the failure of any single memory chip will affect only one ECC bit per word. This allows memory contents to be reconstructed despite the complete failure of one chip. Typical implementations use more advanced codes, such as a BCH code, that can correct multiple bits with less overhead.

Observations from corporate datacenters have shown that memory with chipkill error correction have a lower fraction of memory modules reporting uncorrectable errors compared to memory modules with error correcting codes that can only correct single-bit errors. Academic research has also shown that chipkill memory gave substantially lower memory errors, using both real world memory traces and simulations.

Chipkill operations are being increasingly incorporated into non-volatile memory system (e.g., a NAND flash memory or DIMM) to ensure robust data storage and access.

FIGS. 1-6 overview a non-volatile memory system in which embodiments of the disclosed technology may be implemented.

Figure 1:
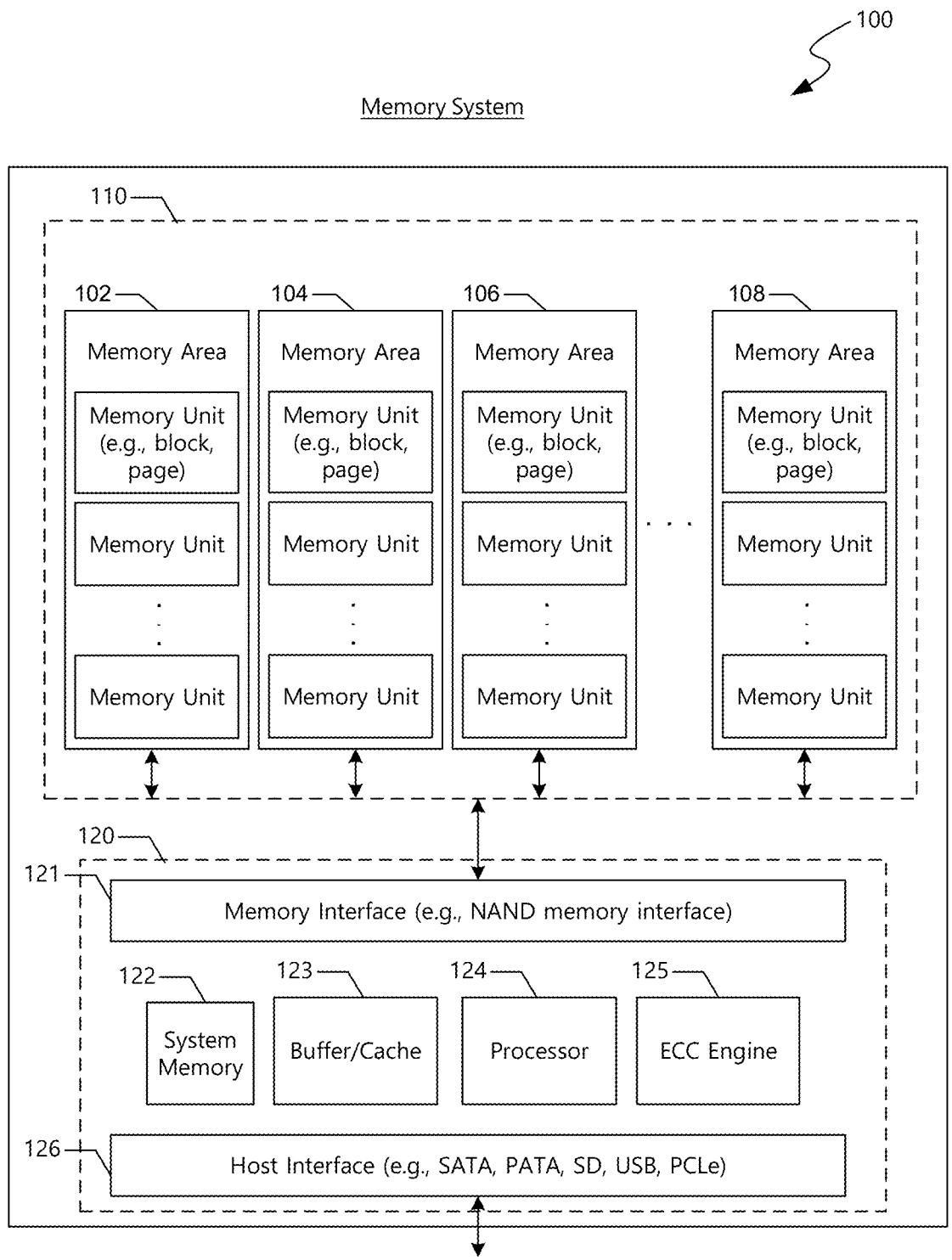
FIG. 1 illustrates an example of a memory system.

FIG. 1 is a block diagram of an example of a memory system 100 that can be implemented in some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive or a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
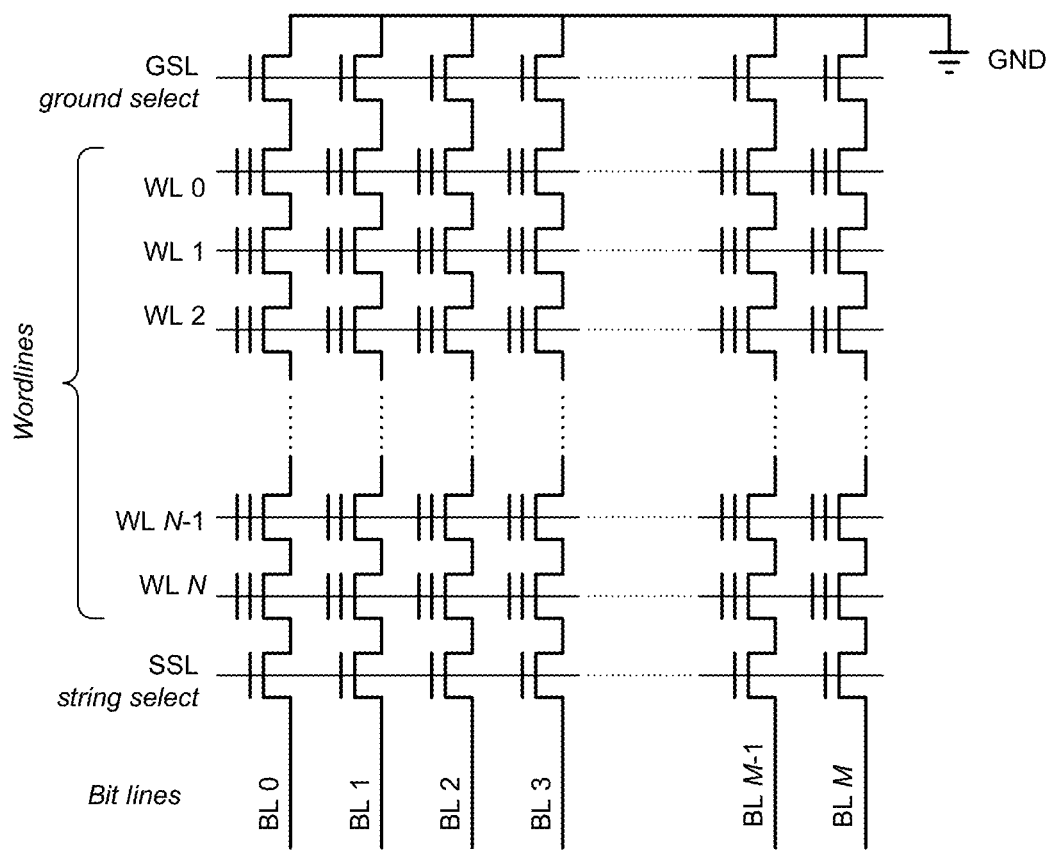
FIG. 2 is an illustration of an example non-volatile memory device.

FIG. 2 illustrates an example of a memory cell array that can be used in some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bitline structure. In another implementation, NAND flash memories may use an all-bitline structure. In the even/odd bitline structure, even and odd bitlines are interleaved along each wordline and are alternatively accessed so that each pair of even and odd bitlines can share peripheral circuits such as page buffers. In an all-bitline structure, all the bitlines are accessed at the same time.

Figure 3:
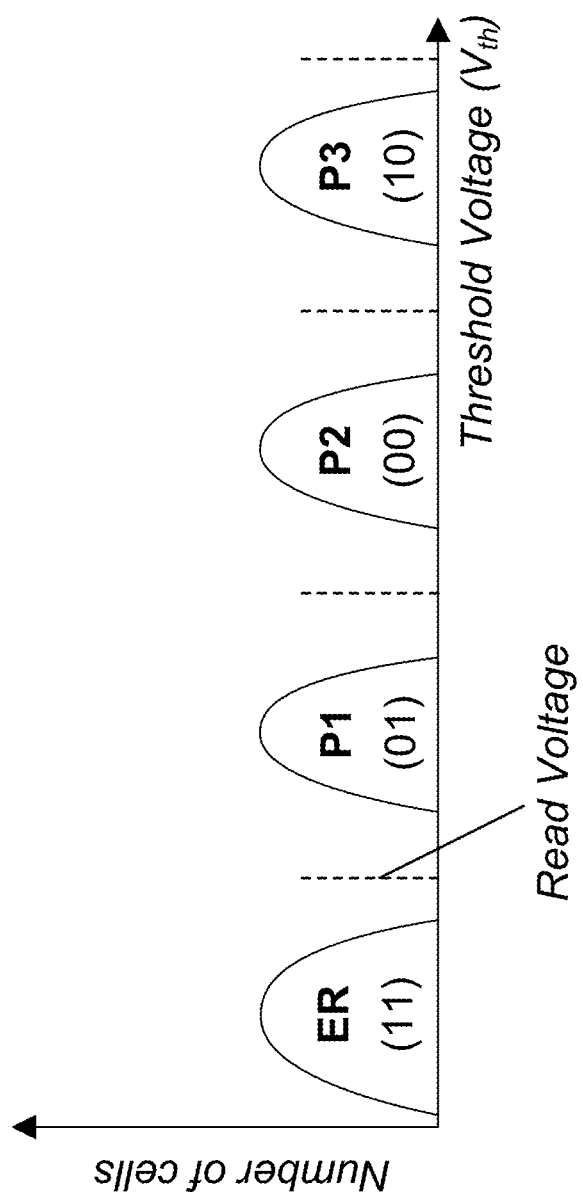
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same wordline are repeatedly programmed using a program-and-verify approach with a stair case program voltage applied to wordlines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
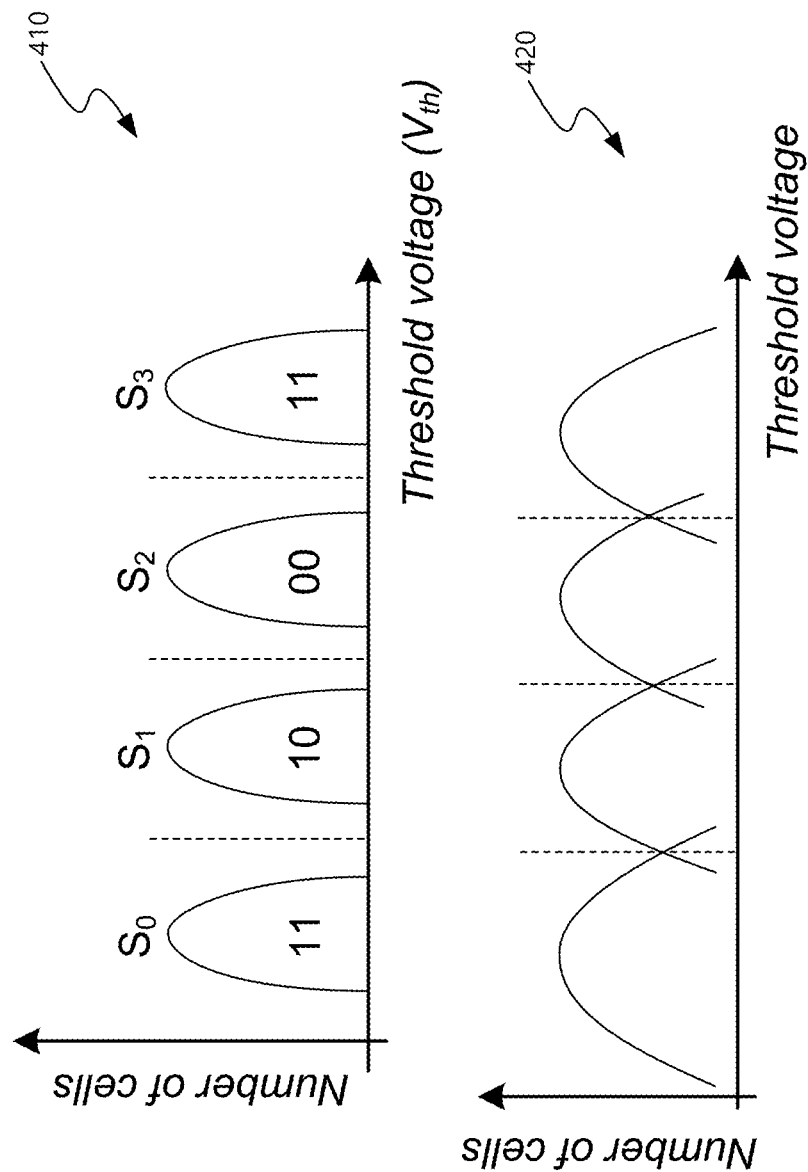
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
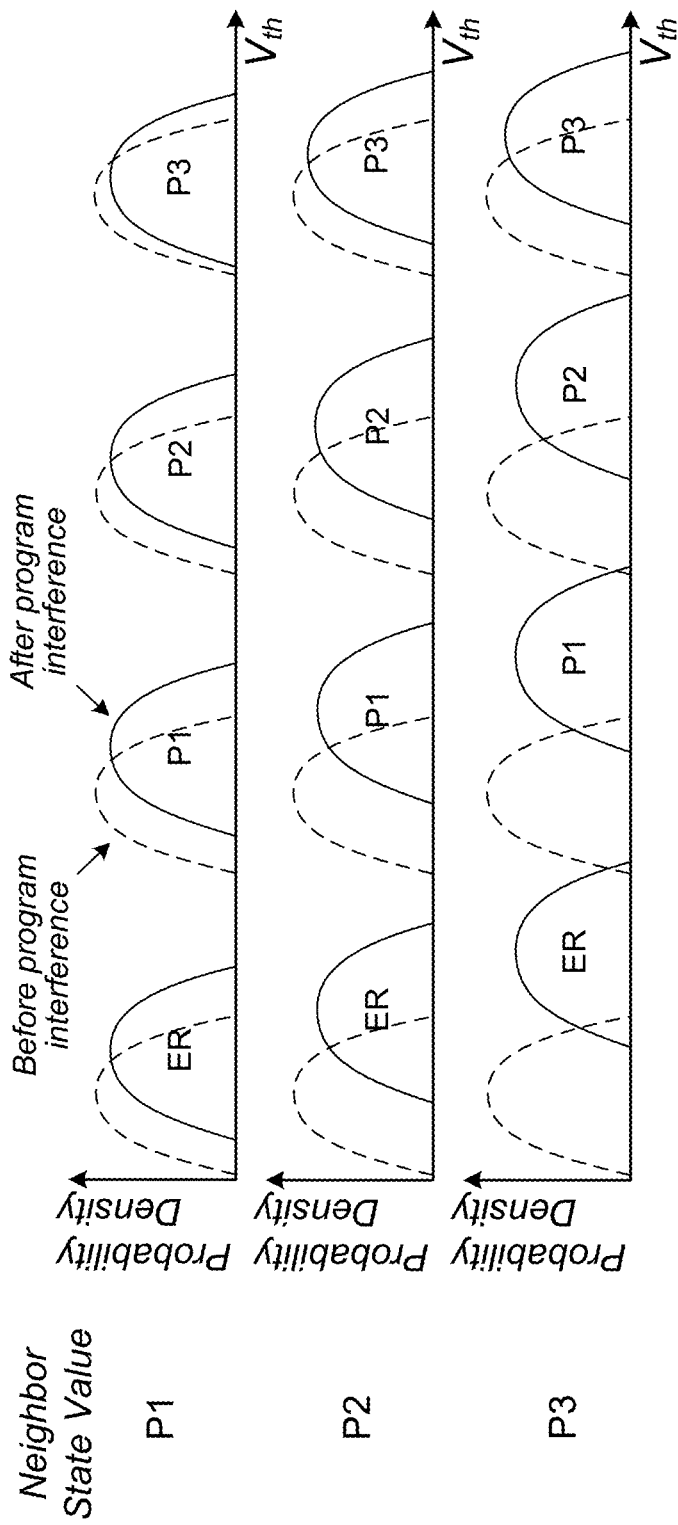
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bitline structure. In the even/odd bitline structure, memory cells on one wordline are alternatively connected to even and odd bitlines and even cells are programmed ahead of odd cells in the same wordline. Therefore, even cells and odd cells experience different amount of cell-to-cell interference. Cells in all-bitline structure suffer less cell-to-cell inference than even cells in the even/odd bitline structure, and the all-bitline structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
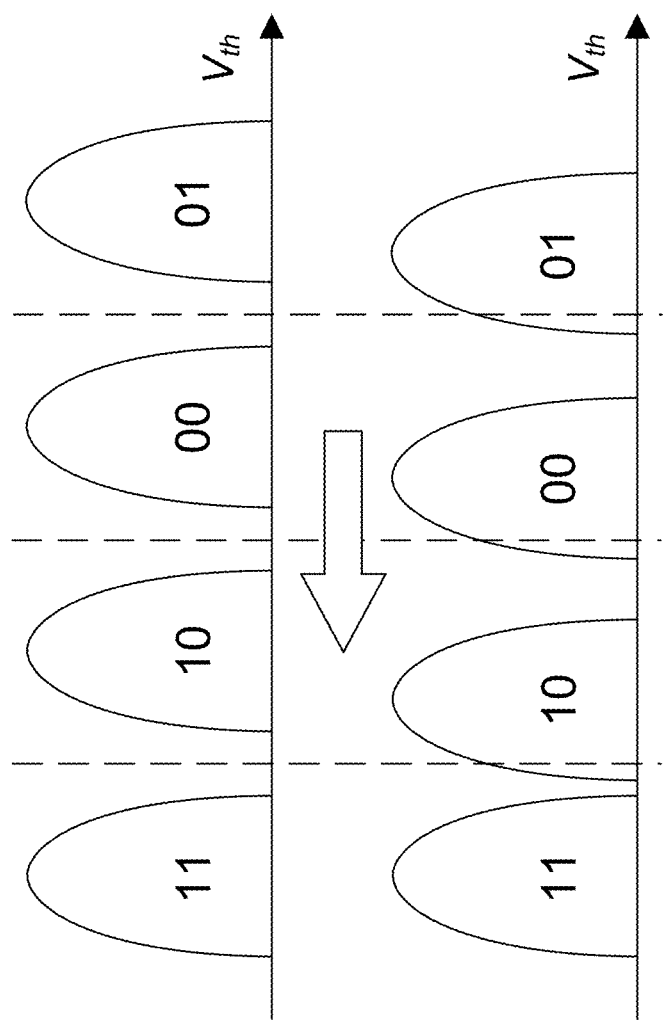
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In some embodiments, soft chipkill recovery for bitline failures can be implemented in the NAND flash memory described in FIGS. 1-6. For example, soft chipkill recovery can be advantageously used if one or more components of non-volatile memory illustrated in FIG. 2 fails prior to or during operation of non-volatile memory system. Causes of a failure may be due to defects during the manufacturing process, mechanical stress to the device prior to or during use, degradation of the dielectric material in memory cells, among others. Failures may occur at the memory cell level, which may propagate and cause failures within other components of non-volatile memory. In some embodiments, a group of memory cells may be considered to fail when no data from any one of the memory cells in the group is writable and/or readable. In other embodiments, a group may be considered to fail when at least one of the memory cells in the group is neither writable and/or readable. In such instances, an error-correcting code (ECC) scheme, such as one or more parity bits, might be used to recover the data in the failed group.

Current chipkill schemes compute parities (using the XOR operation) based on memory cells from the same bitline, which results in it being more difficult to recover from a bitline failure, which is most commonly observed in NAND flash memory. Embodiments of the presently disclosed technology include new methods, devices and systems of generating chipkill parities that can avoid multiple bitline failures.

Figure 7:
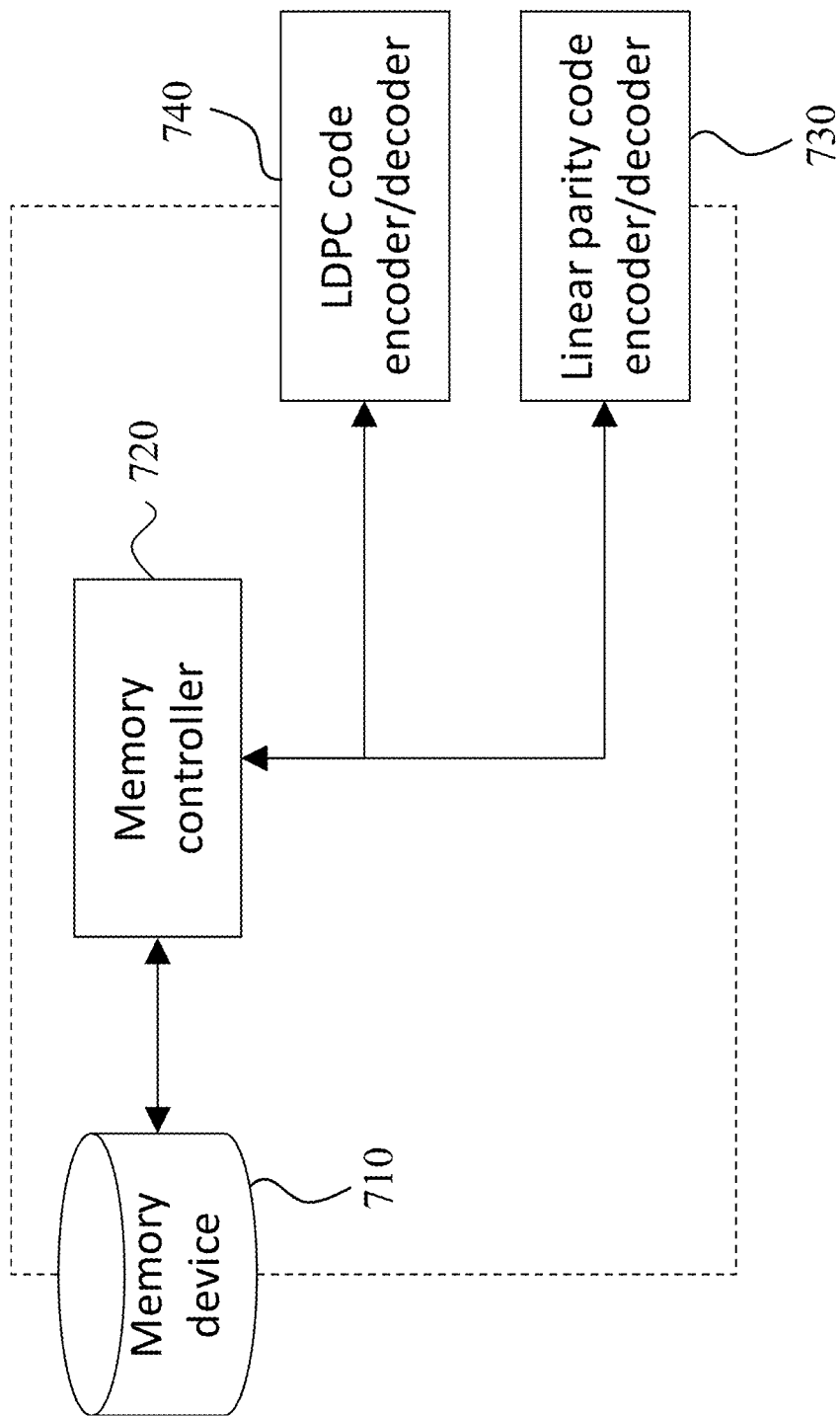
FIG. 7 is a block diagram illustrating an exemplary storage system configured to improve soft chipkill recovery for bitline failures.

FIG. 7 is a block diagram illustrating an exemplary storage system 700 configured to improve soft chipkill recovery for bitline failures. As illustrated in FIG. 7, data is stored on a memory device 710 (e.g., NAND Flash or DIMM). A memory read interface 720 is used to access the data stored on the memory device 710 and interface with two types of error correcting codes that are typically used to ensure the reliability of memory—low-density parity check (LDPC) codes and linear binary codes with parity checks. As illustrated in FIG. 7, both the LDPC code module 740 and the linear parity code module 730 interface with both the memory read interface 720 and the memory device 710. Typically, the LDPC code and linear parity code modules (740 and 730, respectively) include both encoding and decoding functionality, and may support a variety of codeword sizes and code rates. In some embodiments, some or all of the modules in FIG. 7 are implemented using semiconductor components, such as an application-specific integrated circuit (ASIC) or a field-programmable gate array (FPGA).

Figure 8:
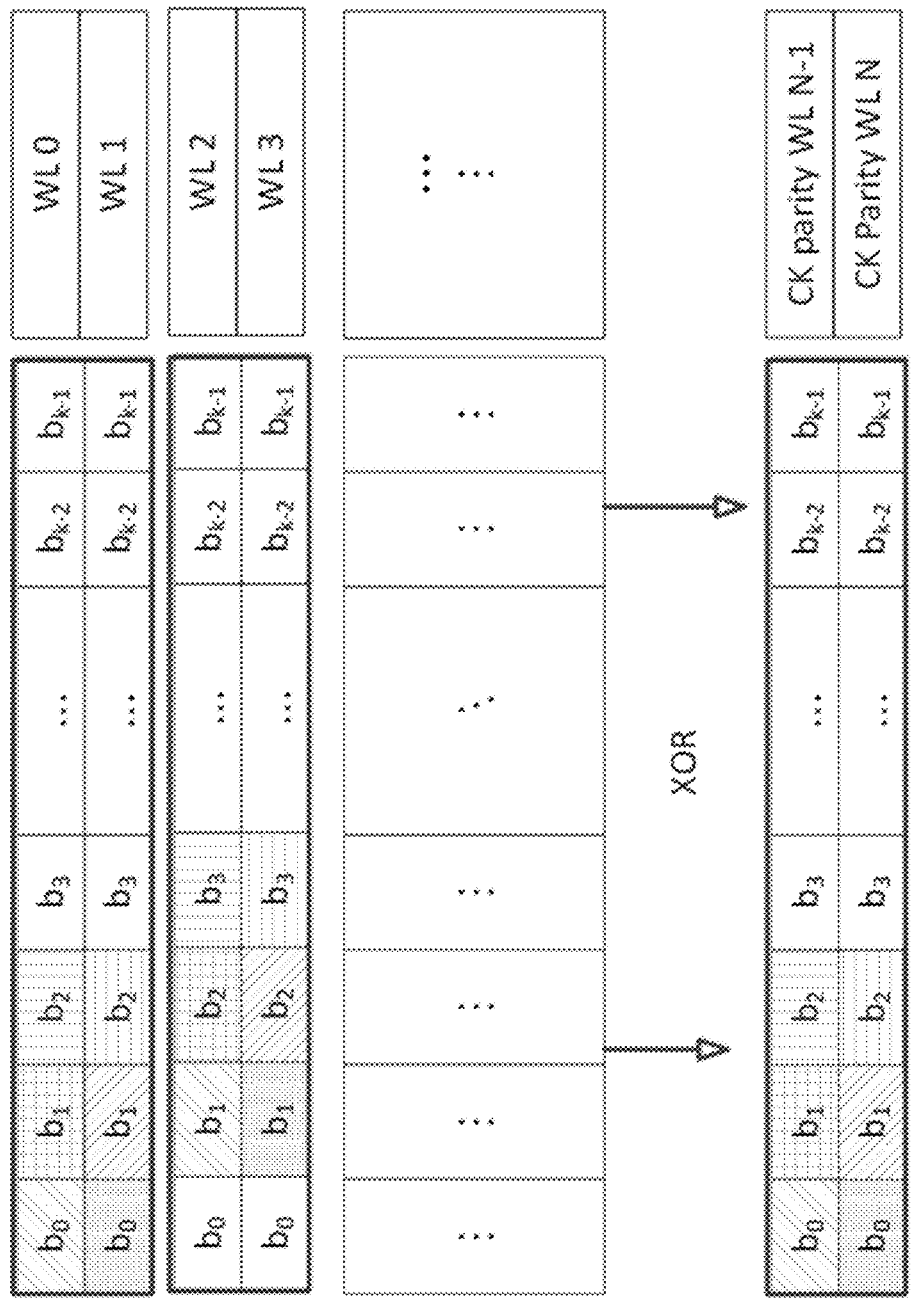
FIG. 8 illustrates an example of generating chipkill parity.

FIG. 8 illustrates an example of generating chipkill parity, in accordance with the presently disclosed technology. As illustrated therein, each wordline (indicated as WL i in FIG. 8, and corresponding to, for example, WL i in FIG. 2 for i=N) includes memory cells whose contents have been encoded using the LDPC code. The parity bits of parity codeword are generated based on XOR operations over data bits that are diagonally positioned across the codewords, as illustrated by the differently shaded bits in FIG. 8. For example, a first parity bit may be generated based on bit b0 in WL 0, bit b1 in WL 2, and so on, and a second parity bit based on bit b0 in WL 1, bit b1 in WL 3, and so on. This advantageously ensures that a single bitline failure can be detected far more robustly since the information in the cells in a particular bitline are distributed across multiple parity bits. Alternatively, this scheme can easily improve correction capability of chip-kill parity if dominant mechanism of failures is by bitline failures.

Another exemplary method for improving soft chipkill recovery for bitline failures is based on detecting bitline failures using successfully decoded wordlines in a block. That is, when chipkill recovery is completed, all wordlines in a block are read and decoded through the LDPC decoder. Successfully decoded wordlines data can used to find bitline error locations based on the intersection of all errors across successfully decoded data. For example, locations where bits are always in error may be identified as potential candidates for a bitline failure. Those bit locations can be erased during the LDPC decoding of failed codewords. This method leverages the fact that errors are randomly distributed, and therefore, errors lying on same location for all successfully decoded wordlines in a block is quite low.

Figure 9:
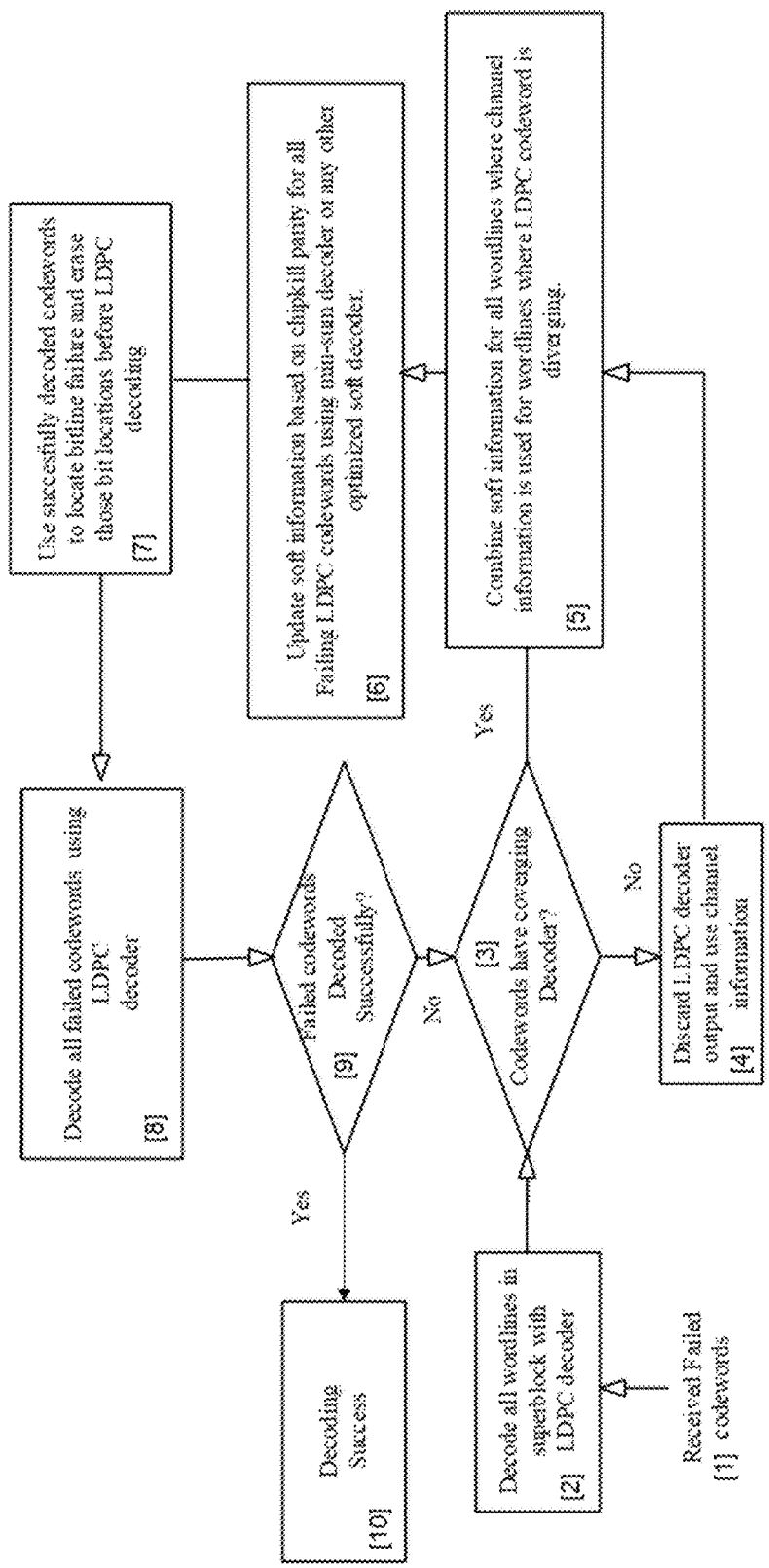
FIG. 9 illustrates a flowchart of an example method for improving soft chipkill recovery for bitline failures.

FIG. 9 illustrates a flowchart for an exemplary method for improving soft chipkill recovery for bitline failures. In this example, it is assumed that a block (or chipkill stripe) comprises n codewords (each corresponding to a wordline), that the chipkill scheme includes the generation of a parity codeword based on the other (n−1) codewords, and that there are $n_b$ bad wordlines. In some embodiments, the bad wordlines are designated as such because they cannot be corrected by the LDPC decoder. In other embodiments, the designation may be based on other conditions. In the context of FIG. 9, and without loss of generality, the bad wordlines may be indexed by 0, 1, 2, . . . , $n_b$-1. The method 900 illustrated in FIG. 9 begins at operation [1], wherein the bad (or failed) codewords are received.

The method 900 includes, at operation [2], decoding all the wordlines in the block.

The method 900 includes, at operation [3], determining whether all the wordlines have been decoded correctly or not.

The method 900 includes, at operation [4], determining that a wordline is not decodable, and discarding the LDPC decoding result. The channel information of this wordline is obtained and is used in a later stage.

The method 900 includes, at operation [5], determining that a wordline is decodable, and passing the LDPC decoding result to the later stage.

The method 900 includes, at operation [6], collecting all channel information of undecodable wordlines and all decoding results of decodable wordlines. Based on this collected information, the soft input information of the $n_b$ bad wordlines are recalculated by a min-sum message passing algorithm or another soft decoding algorithm.

The method 900 includes, at operation [7], comparing the decoding results (of wordlines that have been successfully decoded) and their received information to identify the error locations of these wordlines. With this error location information, if multiple wordlines have the same location, it is highly likely that the location is a bitline failure. Once the bitline failure information has been identified, the soft inputs (generated in operation [6]) corresponding to failed bitline locations are erased. In an example, the soft inputs may be replaced with a 0. In another example, the soft inputs may be replaced with a maximum or minimum soft value.

The method 900 includes, at operation [8], decoding the $n_b$ bad wordlines again using the soft input that was recalculated in operation [7].

The method 900 includes, at operation [9], determining whether there are some bad wordlines that can be decoded. If there are, the decoding results of these newly decoded wordlines are used to update soft input information of the remaining undecodable wordline and the bitline failure information. This procedure is used to decode the remaining failed wordlines.

The method 900 includes, at operation [10], ending the method if all $n_b$ bad wordlines are decoded successfully. Alternatively, the method is ended when a timeout occurs.

Figure 10:
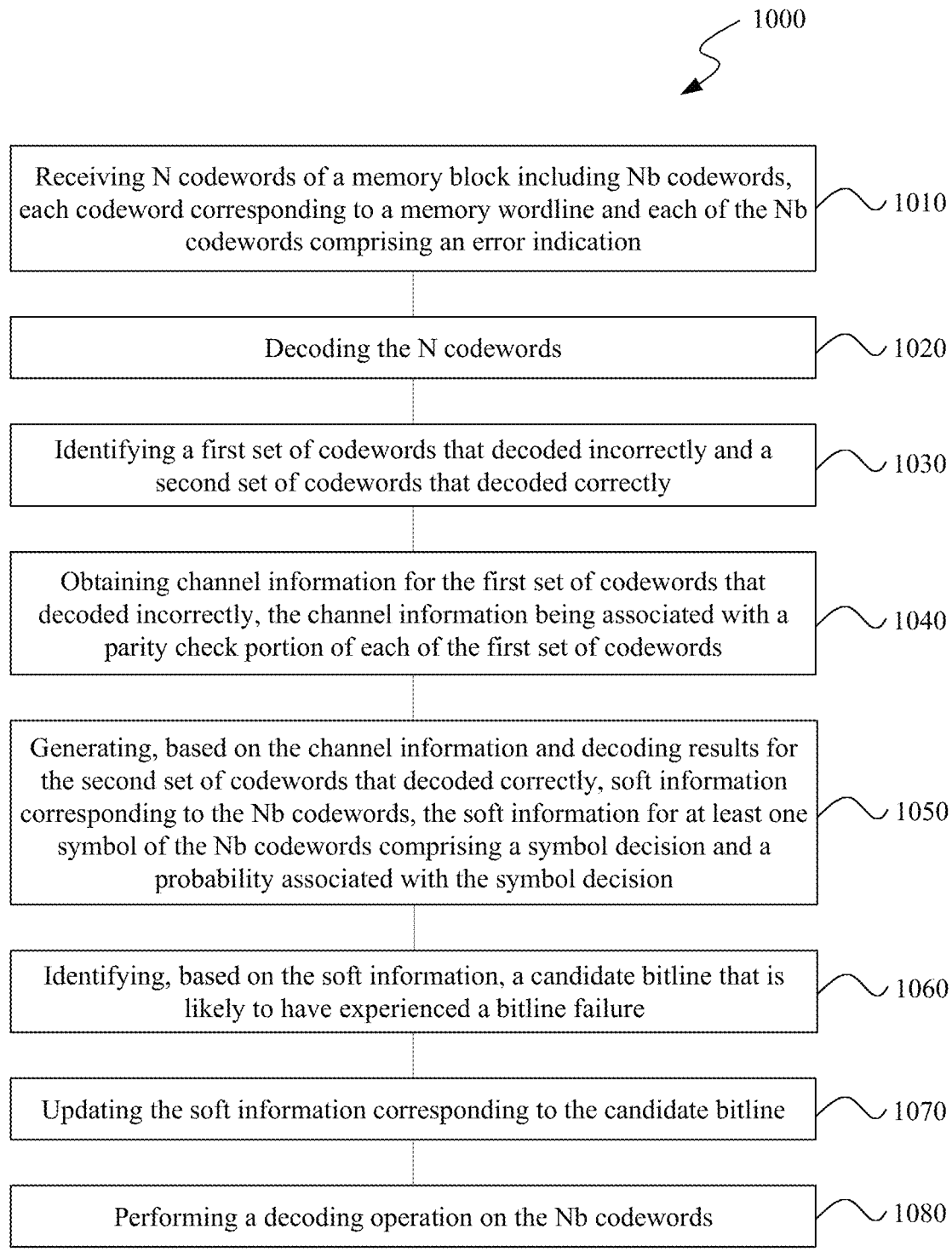
FIG. 10 illustrates a flowchart of another example method for improving performance of a block of a memory device.

FIG. 10 is a flowchart illustrating an exemplary method for improving performance of a block of a memory device by, for example, implementing soft chipkill recovery for bitline failures in a memory device. In some embodiments, the bitline failure may occur in a block of the memory device, the block comprising N codewords. The method 1000 includes, at operation 1010, receiving N codewords of a memory block including Nb codewords, N and Nb being positive integers, Nb being greater than two, Nb being less than N, each codeword corresponding to a memory wordline and each of the Nb codewords comprising an error indication.

The method 1000 includes, at operation 1020, decoding the N codewords.

The method 1000 includes, at operation 1030, identifying a first set of codewords that decoded incorrectly and a second set of codewords that decoded correctly.

The method 1000 includes, at operation 1040, obtaining channel information for the first set of codewords that decoded incorrectly, the channel information being associated with a parity check portion of each of the first set of codewords.

The method 1000 includes, at operation 1050, generating, based on the channel information and decoding results for the second set of codewords that decoded correctly, soft information corresponding to the Nb codewords, the soft information for at least one symbol of the Nb codewords comprising a symbol decision and a probability associated with the symbol decision.

The method 1000 includes, at operation 1060, identifying, based on the soft information, a candidate bitline that is likely to have experienced a bitline failure.

The method 1000 includes, at operation 1070, updating the soft information corresponding to the candidate bitline.

The method 1000 includes, at operation 1080, performing a decoding operation on the Nb codewords.

In some embodiments, updating the soft information is based on a chipkill parity for the Nb codewords.

In some embodiments, identifying the candidate bitline comprises identifying one or more symbol locations in the Nb codewords based on comparing the decoding results and received information for the second set of the N codewords, wherein the chipkill parity is based on the one or more symbol locations.

In some embodiments, the chipkill parity is based on diagonally positioned symbols spanning the Nb codewords.

In some embodiments, generating the soft information is further based on a max-product message passing algorithm or a min-sum message passing algorithm.

In some embodiments, the N codewords are generated based on a low-density parity check (LDPC) code.

In some embodiments, the candidate bitline that is likely to have experienced the bitline failure corresponds to a diverging codeword of the LDPC code.

In some embodiments, the memory device is a NAND flash memory device or a dual in-line memory module (DIMM).

Figure 11:
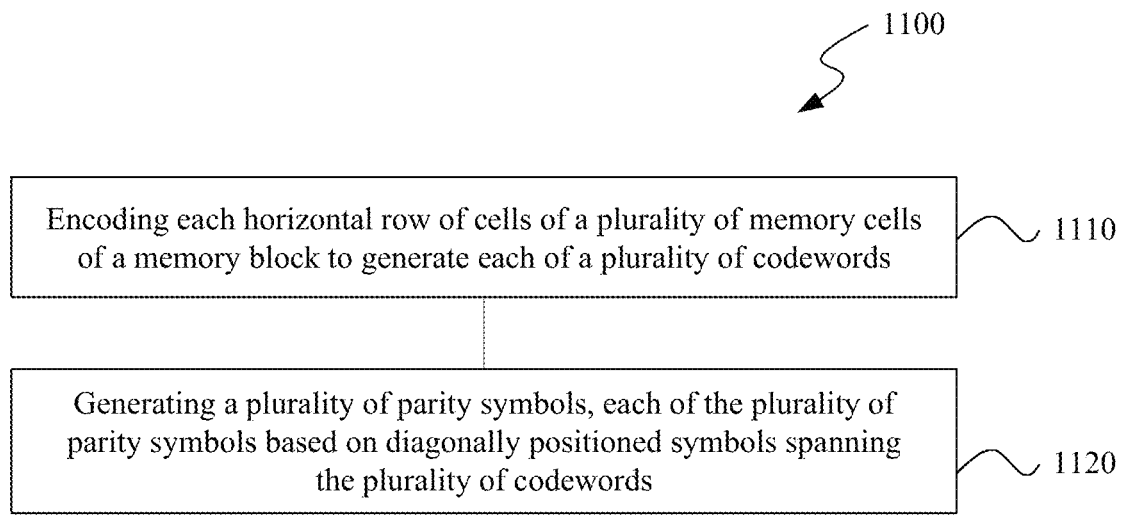
FIG. 11 illustrates a flowchart of yet another example method for improving the performance of a block of a memory device.

FIG. 11 is a flowchart illustrating an exemplary method for improving performance of a block of a memory device by, for example, implementing soft chipkill recovery for bitline failures in a memory device. The method 1100 includes, at operation 1110, encoding each horizontal row of cells of a plurality of memory cells of a memory block to generate each of a plurality of codewords.

The method 1100 includes, at operation 1120, generating a plurality of parity symbols, each of the plurality of parity symbols based on diagonally positioned symbols spanning the plurality of codewords.

Figure 12:
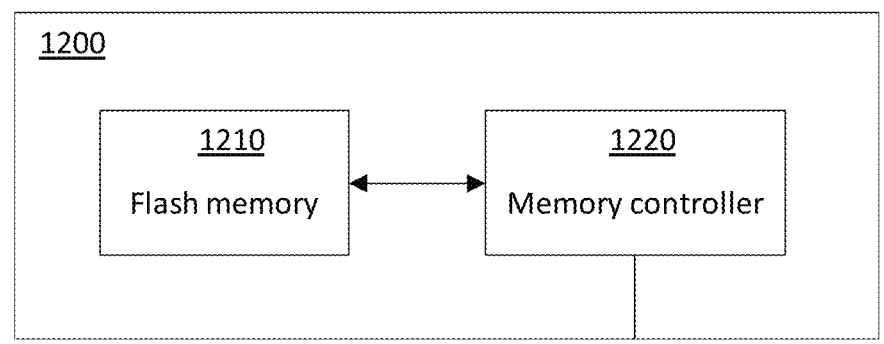
FIG. 12 is a block diagram illustrating an exemplary data storage device that may implement embodiments of the presently disclosed technology.

FIG. 12 is a block diagram illustrating a data storage device according to another example embodiment of inventive concepts. Referring to FIG. 12, a data storage device 1200 may include a flash memory 1210 and a memory controller 1220. The memory controller 1220 may control the flash memory 1210 in response to control signals input from the outside of the data storage device 1200. In the data storage device 1200, the flash memory 1210 may be configured the same or substantially the same as a nonvolatile memory device. That is, the flash memory 1210 may read data from selected memory cells using different read voltages to output it to the memory controller 1220.

The data storage device 1200 may be a memory card device, an SSD device, a multimedia card device, an SD card, a memory stick device, a HDD device, a hybrid drive device, or an USB flash device. For example, the data storage device 1200 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a block of a memory device, comprising:
receiving, by a memory controller of the memory device, N codewords of a memory block including Nb codewords, wherein N and Nb are positive integers, Nb is greater than two, Nb is less than N, each codeword corresponding to a memory wordline and each of the Nb codewords comprising an error indication;
decoding, by a decoder, the N codewords;
identifying a first set of codewords that decoded incorrectly and a second set of codewords that decoded correctly;
obtaining channel information for the first set of codewords that decoded incorrectly, the channel information being associated with a parity check portion of each of the first set of codewords;
generating, based on the channel information and decoding results for the second set of codewords that decoded correctly, soft information corresponding to the Nb codewords, the soft information for at least one symbol of the Nb codewords comprising a symbol decision and a probability associated with the symbol decision;
identifying, based on the soft information, a candidate bitline that is likely to have experienced a bitline failure;
updating the soft information corresponding to the candidate bitline; and
performing a decoding operation on the Nb codewords.

2. The method of claim 1, wherein updating the soft information is based on a chipkill parity for the Nb codewords.

3. The method of claim 2, wherein identifying the candidate bitline comprises:
identifying one or more symbol locations in the Nb codewords based on comparing the decoding results and received information for the second set of the N codewords, wherein the chipkill parity is based on the one or more symbol locations.

4. The method of claim 2, wherein the chipkill parity is based on diagonally positioned symbols spanning the Nb codewords.

5. The method of claim 1, wherein generating the soft information is further based on a max-product message passing algorithm or a min-sum message passing algorithm.

6. The method of claim 1, wherein the N codewords are generated based on a low-density parity check (LDPC) code.

7. The method of claim 6, wherein the candidate bitline that is likely to have experienced the bitline failure corresponds to a diverging codeword of the LDPC code.

8. The method of claim 1, wherein the memory device is a NAND flash memory device or a dual in-line memory module (DIMM).

9. A method for improving performance of a block of a memory device, comprising:
encoding, by an encoder, each horizontal row of cells of a plurality of memory cells of a memory block to generate each of a plurality of codewords; and
generating a plurality of parity symbols, each of the plurality of parity symbols based on diagonally positioned symbols spanning the plurality of codewords.

10. A system for improving performance of a block of a memory device, comprising:
a processor and a memory including instructions stored thereupon, wherein the instructions upon execution by the processor cause the processor to:
receive N codewords of a memory block including Nb codewords, wherein N and Nb are positive integers, Nb is greater than two, Nb is less than N, each codeword corresponding to a memory wordline and each of the Nb codewords comprising an error indication;
decode the N codewords;
identify a first set of codewords that decoded incorrectly and a second set of codewords that decoded correctly;
obtain channel information for the first set of codewords that decoded incorrectly, the channel information being associated with a parity check portion of each of the first set of codewords;
generate, based on the channel information and decoding results for the second set of codewords that decoded correctly, soft information corresponding to the Nb codewords, the soft information for at least one symbol of the Nb codewords comprising a symbol decision and a probability associated with the symbol decision;
identify, based on the soft information, a candidate bitline that is likely to have experienced a bitline failure;
update the soft information corresponding to the candidate bitline; and
perform a decoding operation on the Nb codewords.

11. The system of claim 10, wherein updating the soft information is based on a chipkill parity for the Nb codewords.

12. The system of claim 11, wherein identifying the candidate bitline comprises:
identifying one or more symbol locations in the Nb codewords based on comparing the decoding results and received information for the second set of the N codewords, wherein the chipkill parity is based on the one or more symbol locations.

13. The system of claim 11, wherein the chipkill parity is based on diagonally positioned symbols spanning the Nb codewords.

14. The system of claim 10, wherein generating the soft information is further based on a max-product message passing algorithm or a min-sum message passing algorithm.

15. The system of claim 10, wherein the memory device is a NAND flash memory device or a dual in-line memory module (DIMM).

16. A non-transitory computer-readable storage medium having instructions stored thereupon for improving performance of a block of a memory device, comprising:
instructions for receiving N codewords of a memory block including Nb codewords, wherein N and Nb are positive integers, Nb is greater than two, Nb is less than N, each codeword corresponding to a memory wordline and each of the Nb codewords comprising an error indication;
instructions for decoding the N codewords;
instructions for identifying a first set of codewords that decoded incorrectly and a second set of codewords that decoded correctly;
instructions for obtaining channel information for the first set of codewords that decoded incorrectly, the channel information being associated with a parity check portion of each of the first set of codewords;

instructions for generating, based on the channel information and decoding results for the second set of codewords that decoded correctly, soft information corresponding to the Nb codewords, the soft information for at least one symbol of the Nb codewords comprising a symbol decision and a probability associated with the symbol decision;

instructions for identifying, based on the soft information, a candidate bitline that is likely to have experienced a bitline failure;

instructions for updating the soft information corresponding to the candidate bitline; and instructions for performing a decoding operation on the Nb codewords.

17. The storage medium of claim 16, wherein updating the soft information is based on a chipkill parity for the Nb codewords.

18. The storage medium of claim 17, wherein the instructions for identifying the candidate bitline comprises:

instructions for identifying one or more symbol locations in the Nb codewords based on comparing the decoding results and received information for the second set of the N codewords, wherein the chipkill parity is based on the one or more symbol locations.

19. The storage medium of claim 17, wherein the chipkill parity is based on diagonally positioned symbols spanning the Nb codewords.

20. The storage medium of claim 16, wherein the instructions for generating the soft information is further based on a max-product message passing algorithm or a min-sum message passing algorithm.

* * * * *